(12) United States Patent
Burt et al.

(10) Patent No.: US 7,425,166 B2
(45) Date of Patent: Sep. 16, 2008

(54) METHOD OF SEALING GLASS SUBSTRATES

(75) Inventors: Ronald Lee Burt, Painted Post, NY (US); Stephan Lvovich Logunov, Corning, NY (US); Robert Stephen Wagner, Corning, NY (US); Aiyu Zhang, Mason, OH (US)

(73) Assignee: Corning Incorporated, Corning, NY (US)

( * ) Notice: Subject to any disclaimer, the term of this patent is extended or adjusted under 35 U.S.C. 154(b) by 165 days.

(21) Appl. No.: 11/589,535

(22) Filed: Oct. 30, 2006

(65) Prior Publication Data

US 2007/0128965 A1     Jun. 7, 2007

Related U.S. Application Data

(60) Provisional application No. 60/748,302, filed on Dec. 6, 2005.

(51) Int. Cl.
*H01J 9/00* (2006.01)
*H01J 9/24* (2006.01)

(52) U.S. Cl. .............. 445/25; 445/24; 219/121.65; 219/121.66; 156/272.2; 156/272.8

(58) Field of Classification Search ........... 445/24–25; 219/121.65, 121.66; 156/272.2, 272.8
See application file for complete search history.

(56) References Cited

U.S. PATENT DOCUMENTS

| | | | | |
|---|---|---|---|---|
| 2005/0101059 A1 | 5/2005 | Yang | | 438/127 |
| 2006/0084348 A1* | 4/2006 | Becken et al. | | 445/25 |
| 2007/0090759 A1 | 4/2007 | Choi et al. | | 313/512 |
| 2007/0096631 A1 | 5/2007 | Sung et al. | | 313/498 |
| 2007/0114909 A1 | 5/2007 | Park et al. | | 313/495 |
| 2007/0170324 A1 | 7/2007 | Lee et al. | | 248/247 |
| 2007/0170423 A1 | 7/2007 | Choi et al. | | 257/40 |
| 2007/0170455 A1 | 7/2007 | Choi et al. | | 257/100 |
| 2007/0170605 A1 | 7/2007 | Lee et al. | | 264/1.1 |
| 2007/0170839 A1 | 7/2007 | Choi et al. | | 313/500 |
| 2007/0170845 A1 | 7/2007 | Choi et al. | | 313/504 |
| 2007/0170846 A1 | 7/2007 | Choi et al. | | 313/504 |
| 2007/0170849 A1 | 7/2007 | Park | | 313/506 |
| 2007/0170850 A1 | 7/2007 | Choi et al. | | 313/506 |
| 2007/0170854 A1 | 7/2007 | Kwak | | 313/512 |
| 2007/0170855 A1 | 7/2007 | Choi et al. | | 313/512 |
| 2007/0170856 A1 | 7/2007 | Cha | | 313/512 |
| 2007/0170859 A1 | 7/2007 | Choi et al. | | 313/512 |
| 2007/0170860 A1 | 7/2007 | Choi et al. | | 313/512 |
| 2007/0170861 A1 | 7/2007 | Lee et al. | | 313/512 |
| 2007/0171637 A1* | 7/2007 | Choi | | 362/227 |
| 2007/0173167 A1 | 7/2007 | Choi | | 445/25 |
| 2007/0717637 | 7/2007 | Choi | | 362/227 |

FOREIGN PATENT DOCUMENTS

| | | | |
|---|---|---|---|
| JP | 2001272683 A | * | 10/2001 |
| KR | 2007083148 A | * | 8/2007 |
| WO | WO 2007067384 A2 | * | 6/2007 |

* cited by examiner

*Primary Examiner*—Mariceli Santiago
(74) *Attorney, Agent, or Firm*—Kevin M. Able

(57) ABSTRACT

A method of sealing a plurality of frame-like frit walls disposed between two substrates. The frit walls are arranged in rows and columns and divided into groups, each group being sealed by a separate laser beam. Several strategies are disclosed for the order in which the frit walls are heated and sealed by a laser beam to optimize the efficiency of the sealing process.

20 Claims, 6 Drawing Sheets

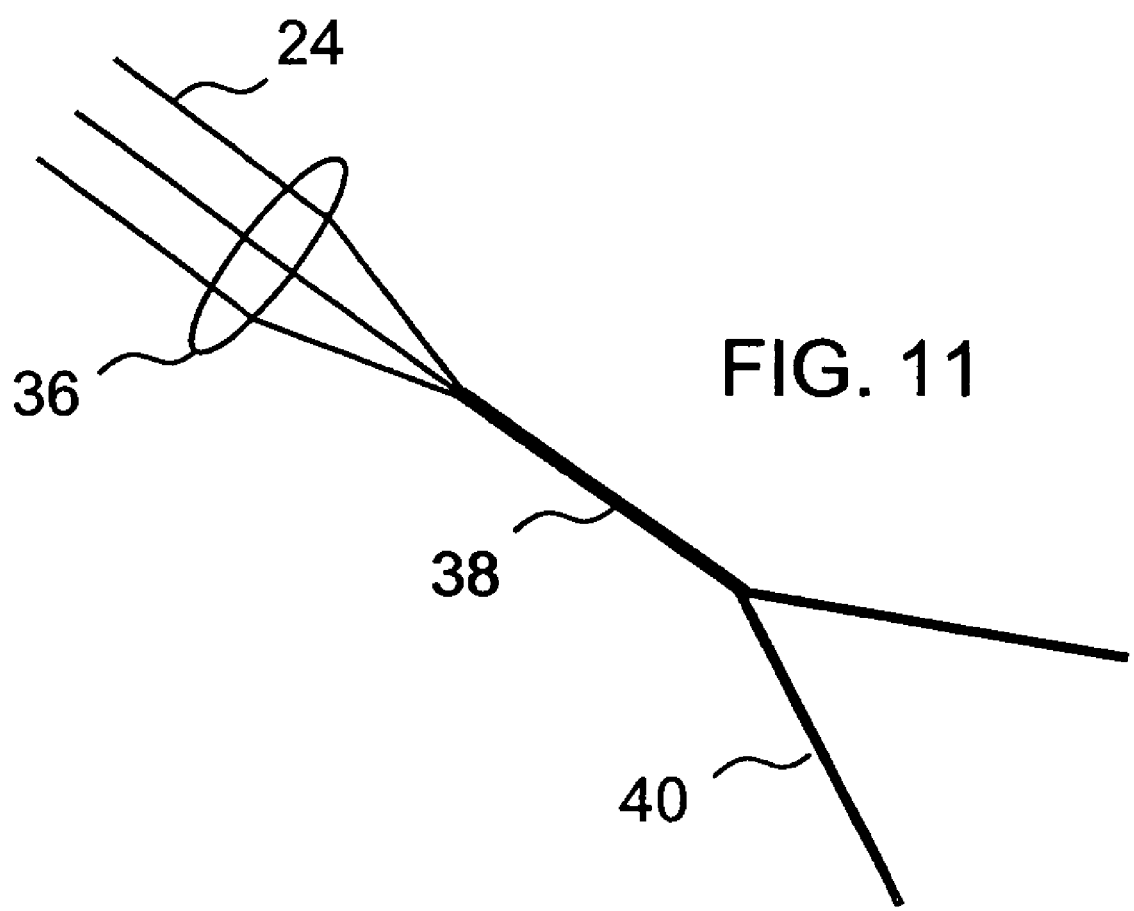

METHOD OF SEALING GLASS SUBSTRATES

This application claims the benefit of priority under 35 U.S.C. § 119(e) of U.S. Provisional Application Ser. No. 60/748,302 filed on Dec. 6, 2005, the content of which is incorporated herein in its entirety by reference.

BACKGROUND OF THE INVENTION

1. Field of the Invention

This invention is directed to a method for encapsulating a plurality of display elements, such as are used for flat panel display devices, comprising common substrates.

2. Technical Background

Organic light emitting diodes (OLEDs) have been the subject of considerable research in recent years because of their use, and potential use, in a wide variety of electroluminescent devices. For instance, a single OLED can be used in a discrete light emitting device or an array of OLEDs can be used in lighting or flat-panel display applications (e.g., OLED displays). OLED flat panel displays in particular are known to be very bright and to have good color contrast and wide viewing angle. It is well known that the life of the OLED display can be significantly increased if the electrodes and organic layers located therein are hermetically sealed from the ambient environment. However, OLED displays, and in particular the electrodes and organic layers located therein, are susceptible to degradation resulting from interaction with oxygen and moisture leaking into the OLED display from the ambient environment. Unfortunately, in the past it has been very difficult to develop a sealing process to hermetically seal the OLED display. Some of the factors that made it difficult to properly seal the OLED display are briefly mentioned below:

- The hermetic seal should provide a barrier for oxygen ($10^{-3}$ cc/m$^2$/day) and water ($10^{-6}$ g/m$^2$/day).
- The size of the hermetic seal should be minimal (e.g., <2 mm) so it does not have an adverse effect on size of the OLED display.
- The temperature generated during the sealing process should not damage the materials (e.g., electrodes and organic layers) within the OLED display. For instance, the first pixels of OLEDs which are located about 1-2 mm from the seal in the OLED display should not be heated to more than 100° C. during the sealing process.
- The gases released during sealing process should not contaminate the materials within the OLED display.
- The hermetic seal should enable electrical connections (e.g., thin-film chromium electrodes) to enter the OLED display.

One way to seal the OLED display is to form a hermetic seal by melting a low temperature frit doped with a material that is highly absorbent at a specific wavelength of light. For example, a high power laser may be used to heat and soften the frit which forms a hermetic seal between a first substrate with the frit located thereon and a second substrate with OLEDs located thereon.

To manufacture display devices in an efficient and economical manner, it is typical that multiple display devices be assembled between substrates, and then separated after assembly and sealing has taken place. There can be, for example, several hundred individual display devices assembled between common substrates. Sealing multiple display devices complicates the sealing process. Not only must each individual display element, or device, meet the foregoing requirements, but the individual display elements must be sealed so as to minimize manufacturing complexity and time.

SUMMARY

Briefly described, an embodiment of the present invention comprises the steps of:

a. providing a first substrate and a second substrate separated by a plurality of frit walls arranged in rows and columns, and at least one display element disposed within an envelope defined by each frit wall and the first and second substrates;

b. impinging a laser beam from a beam source on a start point on a first frit wall in a first row;

c. traversing the beam along the first frit wall from the start point on the first wall to a stop point on the first frit wall, the traversing passing the start point before reaching the stop point, thereby overlapping a portion of the first frit wall;

d. extinguishing the laser beam and indexing to a start point on an adjacent frit wall in the first row;

e. repeating steps b. through d. for each frit wall in the first row; and wherein each step of traversing for each frit wall in the first row is in the same direction.

In another embodiment, a method of encapsulating a display element is disclosed which comprises:

a. providing a first substrate and a second substrate separated by a plurality of frit walls arranged in rows and columns, and at least one display element disposed within an envelope defined by each frit wall and the first and second substrates;

b. impinging a laser beam on a start point on a first frit wall in a first row;

c. traversing the beam along the first frit wall from the start point on the first wall to a stop point on the first frit wall;

d. extinguishing the laser beam and indexing to a start point on an adjacent frit wall in the first row;

e. repeating steps b. through d. for each frit wall in the first row; and wherein the laser beam does not overlap during the traversing for each frit wall The invention will be understood more easily and other objects, characteristics, details and advantages thereof will become more clearly apparent in the course of the following explanatory description, which is given, without in any way implying a limitation, with reference to the attached Figures. It is intended that all such additional systems, methods features and advantages be included within this description, be within the scope of the present invention, and be protected by the accompanying claims.

BRIEF DESCRIPTION OF THE DRAWINGS

FIG. 11 is a diagram of an apparatus for delivering multiple laser beams for sealing.

DETAILED DESCRIPTION

Figure 1:
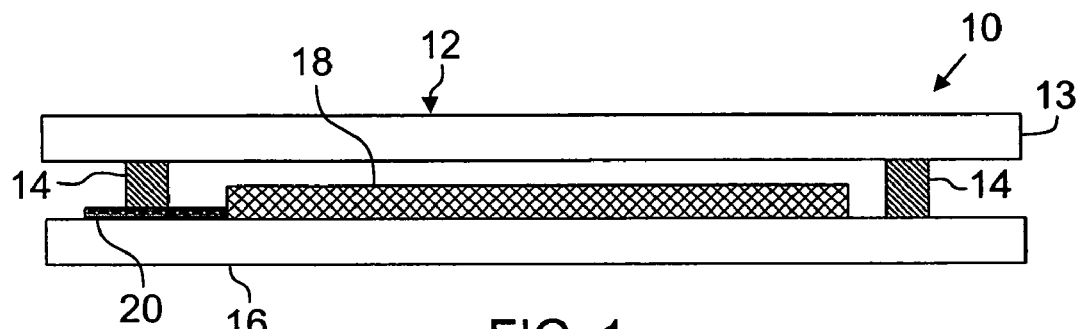
FIG. 1 is a cross sectional side view of a display device according to the present invention.

In the following detailed description, for purposes of explanation and not limitation, example embodiments disclosing specific details are set forth to provide a thorough understanding of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of the present invention. Finally, wherever applicable, like reference numerals refer to like elements.

Although the sealing techniques of the present invention are described below with respect to manufacturing a plurality of hermetically sealed organic light emitting diode (OLED) displays between common substrates, it should be understood that the same or similar sealing techniques can be used to seal two glass plates to one another to form a structure that can be used in a wide variety of applications. Accordingly, the sealing techniques of the present invention should not be construed in a limited manner.

Referring to FIG. 1, a cross-sectional side view of a single organic light emitting diode (OLED) display device in accordance with an embodiment of the present invention is shown, generally designated by reference numeral 10, comprising first substrate 12, frit 14, second substrate 16, at least one OLED element 18 and at least one electrode 20 in electrical contact with the OLED element. Typically, OLED element 18 is in electrical contact with an anode electrode and a cathode electrode. As used herein, electrode 20 in FIG. 1 represents either electrode. Although only a single OLED element is shown for simplicity, display device 10 may have many OLED elements disposed therein. The typical OLED element 18 includes one or more organic layers (not shown) and anode/cathode electrodes. However, it should be readily appreciated by those skilled in the art that any known OLED element 18 or future OLED element 18 can be used in display device 10. In addition, it should be appreciated that another type of thin film device can be deposited besides OLED element 18. For example, thin film sensors may be fabricated using the present invention.

First substrate 12 may be a transparent glass plate like the ones manufactured and sold by Corning Incorporated under the brand names of Code 1737 glass or Eagle 2000™ glass. Alternatively, first substrate 12 can be any transparent glass plate such as, for example, the ones manufactured and sold by Asahi Glass Co. (e.g., OA10 glass and OA21 glass), Nippon Electric Glass Co., NHTechno and Samsung Corning Precision Glass Co. Second substrate 16 may be the same glass substrate as first substrate 12, or second substrate 16 may be a non-transparent substrate.

Figure 2:
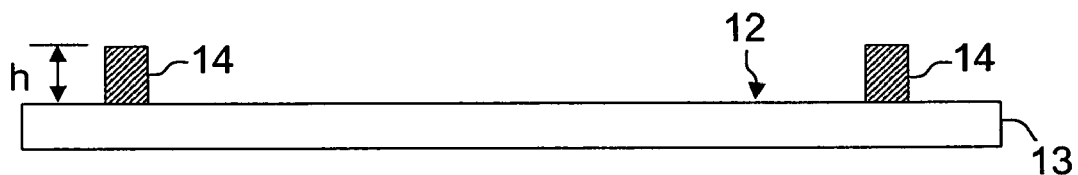
FIG. 2 is a cross sectional side view of the first substrate and the frit deposited thereon.
Figure 3:
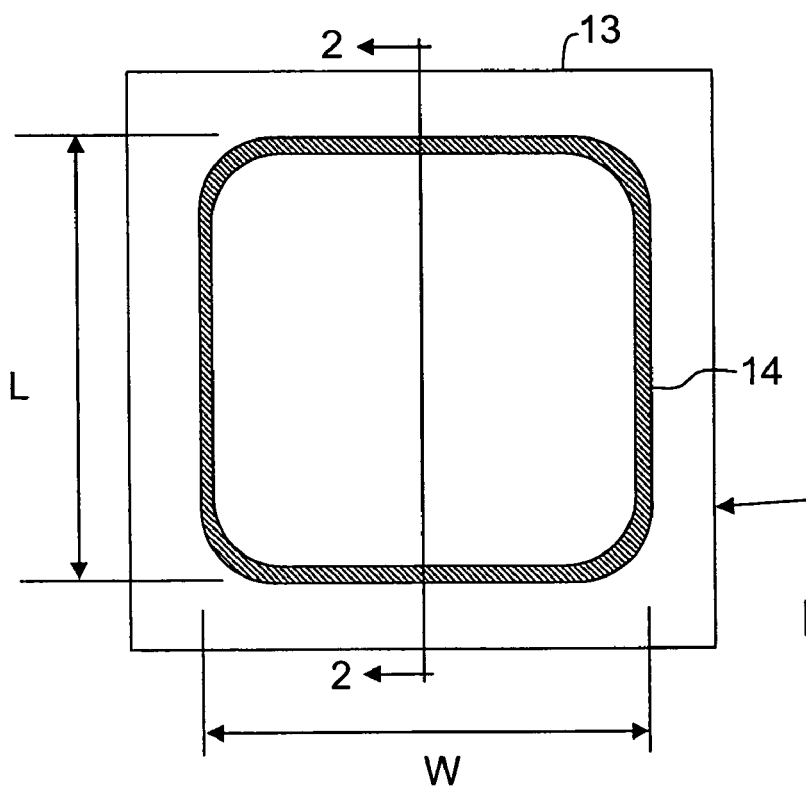
FIG. 3 is a top view of the first substrate of FIG. 2 showing the frit deposited in the shape of a frame or encircling border.

As shown in FIGS. 2-3, prior to sealing first substrate 12 to second substrate 16, frit 14 is deposited on first substrate 12, typically as a line of a frit paste comprising a glass powder, a binder (usually organic) and/or a liquid vehicle. Frit 14 can be applied to first substrate 12, for example, by screen-printing or by a programmable auger robot which provides a well-shaped pattern on first substrate 12. For example, frit 14 can be placed approximately 1 mm away from the free edges 13 of first substrate 12, and is typically deposited in the shape of a closed frame or wall. By frame what is meant is an enclosing border of frit which, when the substrates are joined, will encircle or surround an OLED element, similar to a picture frame. In a preferred embodiment, frit 14 is a low temperature glass frit that has a substantial optical absorption cross-section at a predetermined wavelength which matches or substantially matches the operating wavelength of a laser used in the sealing process. Frit 14 may, for example, contain one or more light absorbing ions chosen from the group including iron, copper, vanadium, neodymium and combinations thereof (for example). Frit 14 may also be doped with a filler (e.g., an inversion filler or an additive filler) which changes the coefficient of thermal expansion of frit 14 so that it matches or substantially matches the coefficient of thermal expansions of substrates 12 and 16. For a more detailed description regarding exemplary frit compositions that may be used in this application, reference is made to U.S. Pat. No. 6,998,776 entitled "Glass Package that is Hermetically Sealed with a Frit and Method of Fabrication", the contents of which are incorporated by reference herein.

Frit 14 may also be pre-sintered prior to sealing first substrate 12 to second substrate 16. To accomplish this, frit 14, which was deposited onto first substrate 12, is heated so that it becomes attached to first substrate 12. Then, first substrate 12 with the frit pattern located thereon can then be placed in a furnace which "fires" or consolidates frit 14 at a temperature that depends on the composition of the frit. During the pre-sintering phase, frit 14 is heated and organic binder materials contained within the frit are burned out.

After frit 14 is pre-sintered, it can be ground, if necessary, so that the height variation along the frit line does not exceed about 2-4 µm, with a typical target height h which can be 10 µm to greater than 30 µm, depending on the application for device 10; however, more typically height h is about 12-15 µm. If the height variation is larger, a gap which may be formed between the frit and substrate 16 when substrates 12 and 16 are joined may not close when frit 12 melts during laser sealing to a second substrate, or the gap may introduce stresses which can crack the substrates, particularly during cooling of the frit and/or substrates. An adequate but not overly thick frit height h allows the substrates to be sealed from the backside of first substrate 12. If frit 14 is too thin it does not leave enough material to absorb the laser radiation, resulting in failure. If frit 14 is too thick it will be able to absorb enough energy at the first surface to melt, but will prevent the necessary energy needed to melt the frit from reaching the region of the frit proximate secondary substrate 16. This usually results in poor or spotty bonding of the two glass substrates.

If the pre-sintered frit 14 is ground, first substrate 12 may go through a mild ultrasonic cleaning environment to remove any debris that has accumulated to this point. The typical solutions used here can be considerably milder than the ones used for cleaning display glass which has no additional deposition. During cleaning, the temperature can be kept low to avoid degradation of deposited frit 14.

After cleaning, a final processing step can be performed to remove residual moisture. The pre-sintered first substrate 12 can be placed in a vacuum oven at a temperature of 100° C. for 6 or more hours. After removal from the oven, the pre-sintered first substrate 12 can be placed in a clean room box to deter dust and debris from accumulating on it before performing the sealing process.

Figure 4:
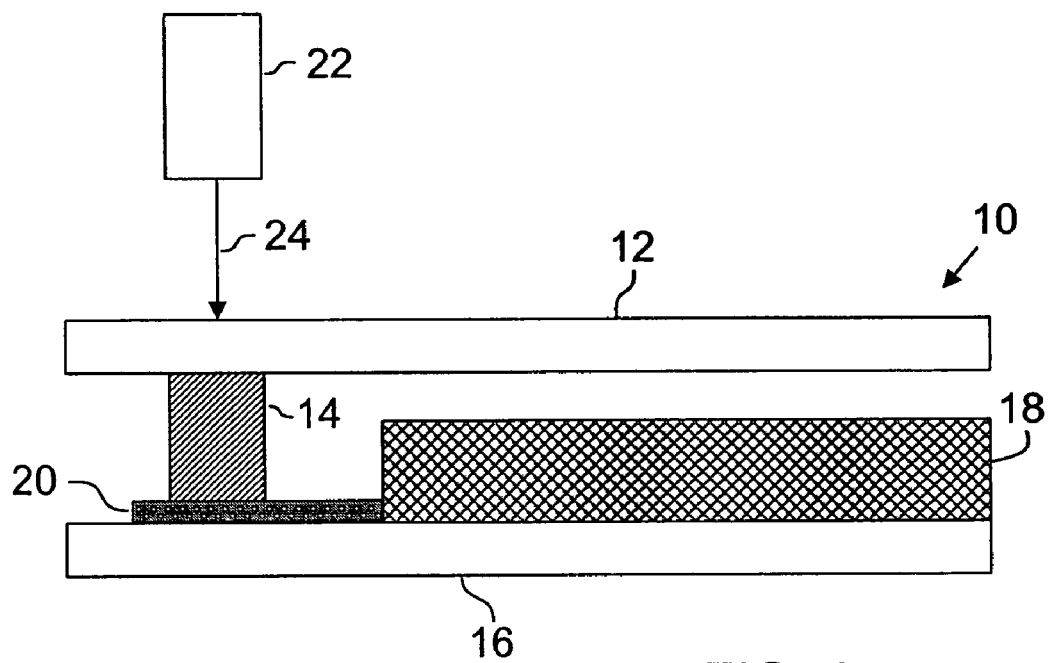
FIG. 4 is a top view of a portion of the device of FIG. 1 showing the position of the laser and laser beam during the sealing operation.

The sealing process includes placing first substrate 12, with frit 14, on top of second substrate 16, with one or more OLEDs 18 and one or more electrodes 20 deposited on the second substrate 16, in such a manner that frit 14, the one or more OLEDs 18, and electrodes 20 are sandwiched between the two substrates 12 and 16 separated by frit 14. Mild pressure can be applied to substrates 12 and 16 to keep them in contact with frit 14 during the sealing process. As shown in FIG. 4, laser 22 directs laser beam 24 onto frit 14 through first substrate 12 and heats frit 14 such that frit 14 melts and forms a hermetic seal which connects and bonds substrate 12 to substrate 16. The hermetic seal also protects OLEDs 18 by preventing oxygen and moisture in the ambient environment from entering into OLED display 10.

One method of conveying laser beam 24 relative to frit 14 is by passing the laser beam through an optical fiber. Beneficially, such techniques do not require direct line of sight between the laser and device 10. Another approach is to reflect the laser beam from one or more galvometer-positioned reflectors (e.g. mirrors) onto the frit. Galvometer positioned reflectors allow the beam to be easily directed along the frit line without having to move the bulky and electrically tethered laser. Modifying optics, such as telecentric lenses, may be required to maintain a constant beam diameter as the beam length between the laser and the frit changes. The resulting hermetic seal should:

provide a barrier for oxygen ($10^{-3}$ cc/m$^2$/day) and water ($10^{-6}$ g/m$^2$ day);

be minimal in size (e.g., <2 mm) so it does not have an adverse effect on size of the OLED display;

not require temperatures during the sealing process which might damage the materials (e.g., electrodes and organic layers) within the OLED display. For instance, the first pixels of OLEDs which are located about 1-2 mm from the seal in the OLED display should not be heated to more than 100° C. during the sealing process;

not contaminate the materials within the OLED display during the formation thereof;

enable electrical connections (e.g., thin-film chromium electrodes) to enter the OLED display.

As will be apparent to the skilled artisan, to promote efficient fabrication through economies of scale, substrates 12 and 16 may be common substrates and enclose a plurality of individual display elements, each display element comprising a frit wall and a plurality of OLED elements. Each display element, when separated from the parent, joined substrates, will form an individual display device 10. For example, substrates 12 and 16 may comprise hundreds of display elements, each display element, when separated from the parent structure, may form a display in a cell phone, for example. Of course, the need to hermetically seal large numbers of individual display elements between common substrates demands an efficient sealing process if the economies associated with simultaneous assembly are to be realized.

Figure 5:
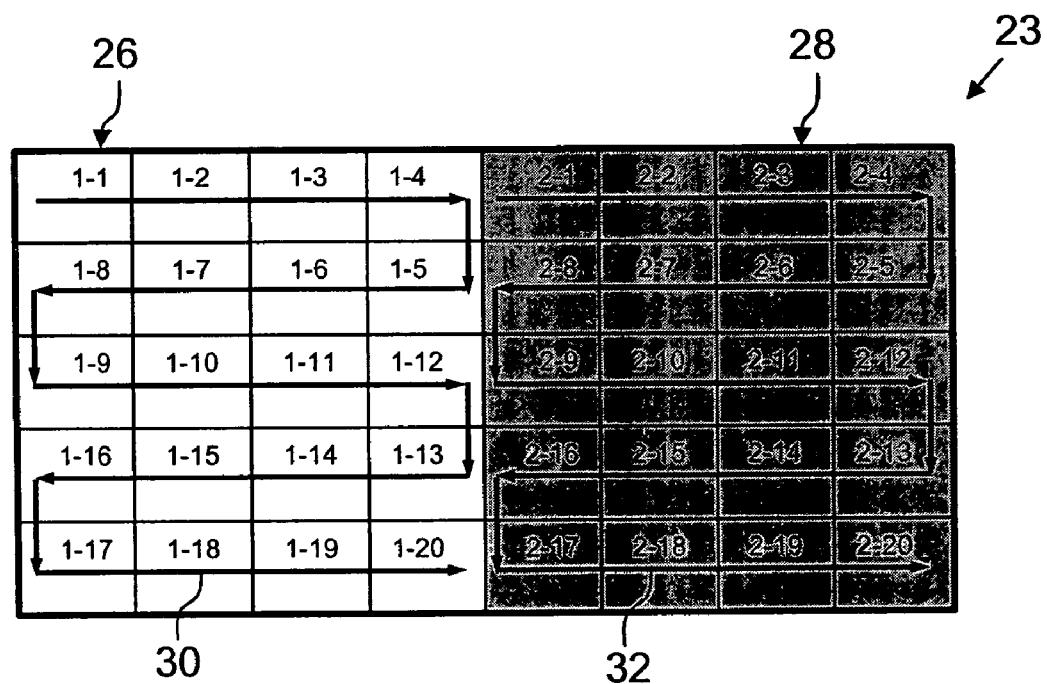
FIG. 5 is a top down view of an array of display elements disposed between common substrates, the display elements comprising a plurality of frit walls arranged in rows and columns, divided into several regions for sealing by separate lasers, and showing the sealing pattern for each element in turn.

In accordance with an embodiment of the present invention, a sealing method is disclosed wherein a plurality of laser beams are used to seal a plurality of display elements in an efficient manner. Preferably, the display elements are arranged in an array comprising rows and columns. In the present exemplary embodiment, two lasers are used to seal the array of display elements. The embodiment is best illustrated in FIG. 5 showing a top-down diagram of the sealing method for a display structure 23 comprising a plurality of individual display elements disposed between common substrates 12 and 16, each individual display element comprising a wall of frit, wherein a first laser beam 24 is traversed from one display element to another display element in a prescribed pattern. In the figure, each individual frit pattern is designated by a number, e.g. 1-1, 1-2, 1-3, etc., and will be referred to hereinafter as a cell. The first number in the designation is a sealing pattern number, whereas the second number is the cell number. Thus, 1-1 represents the first cell of the first pattern, 1-2 represents the second cell of the first pattern, and 2-14 represents the 14$^{th}$ cell of the second pattern. Two sealing patterns 30, 32 are depicted in FIG. 5, each sealing pattern represented as a zig-zag pattern of arrows. Thus, the large display structure 23 comprises a plurality of cells shown segmented into two regions, 26, 28 (shown as a white region and a shaded region, respectively), each region being sealed with a laser beam dedicated to that specific region. Each region 26, 28 preferably contains a number of individual cells equal to the other region. The duty time for each laser as it traces its respective pattern is preferably the same, assuming the same start time, stop time and traverse rate, therefore making efficient use of the lasers. Duty time, as used herein, refers to the "on" period of the laser. Thus, if the two lasers begin the sealing operation at the same time, they will, ideally, complete the sealing operation at the same time. Note that FIG. 5 does not indicate a sealing route for each individual cell, i.e. the pattern traced by the respective laser beams as they heat the frit, only the route traced by the respective laser beam as it moves from one cell to another cell. In the orientation indicated in FIG. 5, sealing of individual cells is accomplished in a row-wise manner, wherein the laser beam seals the frit for each cell progressively across a row. At the completion of the sealing operation for a row, the beam moves "down" the last column in the row sequence to the next adjacent row, and begins the sealing process for cells across the new row in a direction opposite the previous direction. It should be apparent that at the completion of the sealing process for a first row, the laser beam could just as easily move "up", if the sealing operation began at a center row for example. To that end, the terms "up", "down" and other directional references, unless otherwise indicated, are with respect to the figures and for descriptive purposes only. Again, movement of the laser beam from cell to cell is indicated by the arrows shown by references 30 and 32. Also, FIG. 5 illustrates each cell as being immediately adjacent and to and in contact with its nearest neighbors. In practice, individual cells are disposed apart from one another in order to facilitate separation into individual display devices.

Figure 6:
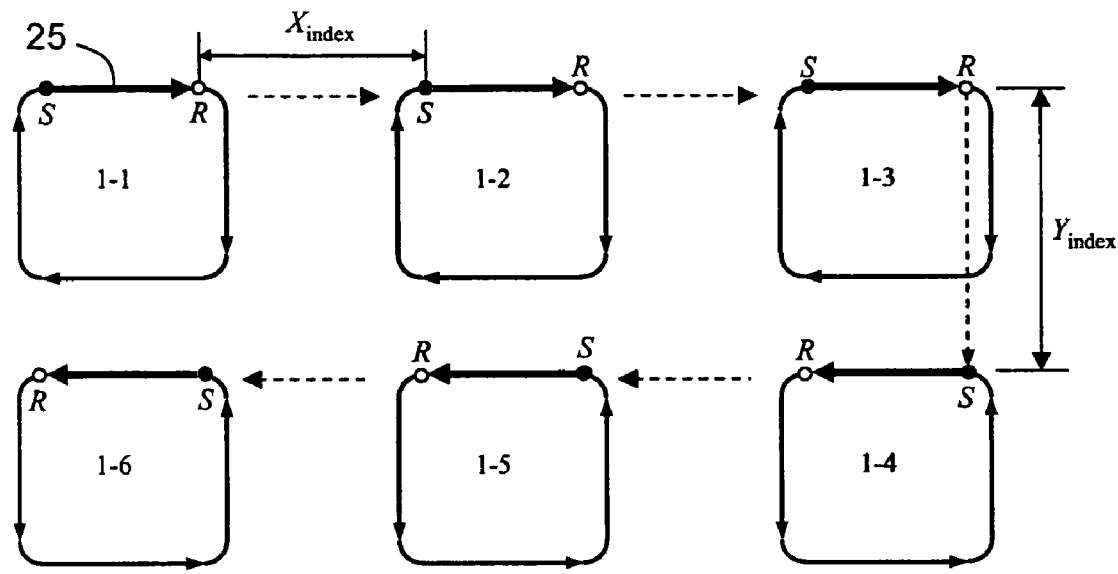
FIG. 6 is top down view of a region of FIG. 5 showing a sealing pattern according to an embodiment of the present invention.

FIG. 6 diagrammatically illustrates a portion of the sealing method depicted in FIG. 5 showing the sealing pattern used for each cell (i.e. each wall of frit 14). Note that FIG. 6 uses cell designations similar to FIG. 5. In the sealing method shown in FIG. 6, the laser beam changes direction in its traverse about each cell at each new and sequential row. That is, as indicated by the dashed arrows, the laser beam moves from left to right in the figure, and traces a clockwise path for each cell in the first (top) row. When beam 24 reaches the last column of the row (at the extreme right), the beam position is first moved (indexed) to the next adjacent row, and then traces a counterclockwise rotation about each cell in the second row. This method increases the efficiency of the process by matching the direction of the laser as it moves from cell to cell within a row, to the laser start direction as it traverses each individual cell. The laser indexes from cell to cell in FIG. 6, wherein the indexing refers to movement of the laser beam from one cell to the next cell. Preferably, the laser is off during the indexing period. Thus, $X_{index}$, $Y_{index}$ and $XY_{index}$ refer, respectively, to the movement of the beam in the x-direction (horizontal, or row-wise) between cells when the laser is also preferably off, movement of the beam in the y direction (vertical or column-wise) between cells when the laser is preferably off, and movement in both X and Y directions between cells when the laser is preferably off.

The method depicted in FIG. 6 uses the shortest amount of non-sealing (indexing) movement of the laser beam as it moves from cell to cell and row to row. Also, the laser retraces a path over the initial leg of the pattern for each cell in each row, thereby helping to reduce stress in the sealed device by reheating at least a portion of the device at the frit seal. For example, each individual cell in FIG. 6 consists of a substantially rectangular shape with rounded corners. Note that if the laser begins sealing of the upper left cell (cell 1-1) at the upper left "corner" of the cell, and moves in a clockwise direction around the cell, it retraces the path indicated by the heavy arrow pointing from point S to point R and designated by reference numeral 25 over the upper most side of the cell before indexing to the second cell (cell 1-2) in the row. Point S represents an "on" position for the laser, while position R represents an "off" position. In this method, the beam once the beam is turned on at point "S", it completes traces around the frit, and overlaps between points "S" and "R" before turning off at the second passing of "R".

Figure 7:
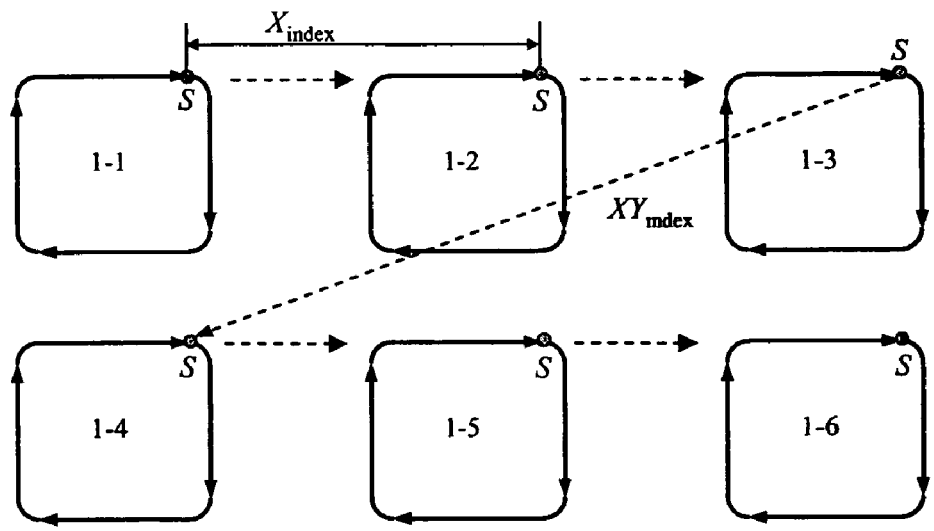
FIG. 7 is a top down view of a region of FIG. 5 showing another sealing pattern according to an embodiment of the present invention.

Another embodiment similar to the embodiment shown in FIG. 6 is illustrated in FIG. 7. In FIG. 7, the laser beam does not overlap during an "on" cycle, but instead indexes (moves with the laser off from one laser "on" point to another laser "on" point) from start point S of one cell to the start point S of the next cell (indicated by the small circle on each cell). In this embodiment, S represents both an "on" and an "off" position. Thus, the laser turns on in the upper right portion of the first, upper left cell (cell 1-1), traverses clockwise around the cell until the beam again reaches the first cell start point S, then turns off as the beam position is reoriented to the start point S in the second cell (cell 1-2). This pattern is repeated for each cell in the first row, after which the laser turns off while the beam position is traversed or reoriented from the last start-stop position S in the first row (cell 1-3 in the figure) and proceeds to the start-stop position in the first cell (cell 1-4) of the second row and repeats a pattern as described in above for the first (top) row. Note that each cell of each row is traversed in a clockwise rotation. Of course, if sealing was initiated in the opposite direction (e.g. starting from cell 1-3, moving from right to left), the foregoing directions would be reversed.

Figures 8, 9:
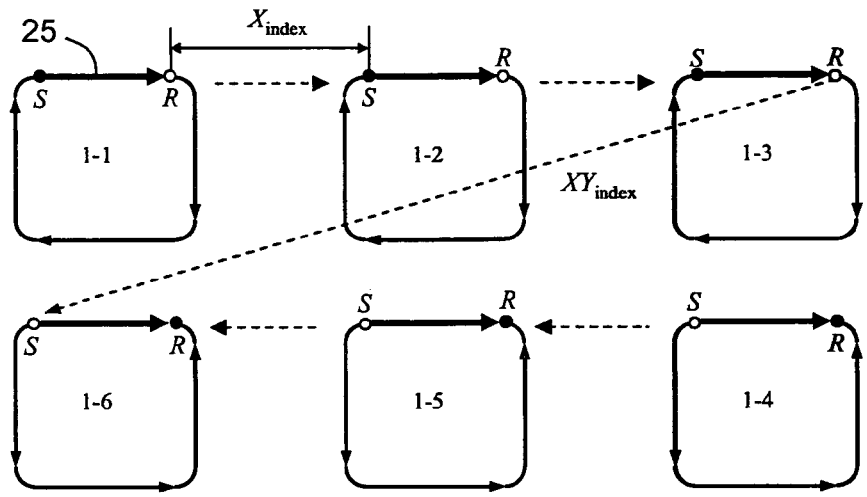
FIG. 8 is a top down view of a region of FIG. 5 showing another sealing pattern according to an embodiment of the present invention.
FIG. 9 is a top down view of a display structure comprising a plurality of frit walls arranged in rows and columns, divided into several regions for sealing by separate lasers, and showing the sealing patterns, and wherein the regions have an unequal number of frit walls

Shown in FIG. 8 is another embodiment of the present invention similar to that illustrated in FIG. 6, except that in FIG. 8, instead of indexing to the nearest adjacent cell of the next row at the completion of the first row of cells, the laser beam indexes diagonally to the first cell in the next adjacent row, i.e. to the cell in the second row farthest from the ending cell of the first row. Put another way, and referring to FIG. 8, the laser traverses the first row from left to right, from the first cell at the left to the last cell to the right. The beam then indexes to the first cell in the second row (at the extreme left in FIG. 8), and again traverses from left to right. Note that in the method shown in FIG. 8, the indexing distance between the last cell to be sealed in the first row and the first cell to be sealed in the second row is longer than that shown in the method of FIG. 6. Also, in the method of FIG. 8, the sealing direction for each cell is the same (e.g. clockwise), as opposed to reversing for every other row, as occurs in the method of FIG. 6.

Shown in FIG. 9 is yet another embodiment of the present invention wherein the two regions 26, 28 previously identified in FIG. 5 do not have an equal number of cells in each region. Thus, as depicted in FIG. 9, the second sealing laser completes the sealing of the cells in region 28, and is idle (laser off) during the time the remaining cells in the first region 26 are being sealed by the first laser. This embodiment, while acceptable, is not as efficient as the previous embodiment wherein the two lasers have equal duty times. FIG. 9 conforms to the previous depictions in that cells are referred to according to region and cell number, thus 1-1 is cell 1 of region 1, whereas 2-16 refers to cell 16 of region 2. Moreover, FIG. 9 is intended to show diagrammatically the general layout of the cells and regions, and not the specific individual positioning of individual cells.

Figure 10:
FIG. 10 is a top down view of a large display structure comprising a plurality of frit walls arranged in rows and columns, divided into a large number of regions for sealing by separate lasers.

FIG. 10 illustrates yet another strategy for very large display structure 23 having a large number of individual cells. As illustrated in FIG. 10, display structure 23 has been divided into 6 regions, each region having the same number of cells divided into rows and columns. Display structure 23 in FIG. 10 comprises 150 cells, six regions of 25 cells each. The cells of each region are sealed by a separate laser, in this example, six lasers. Although the method of FIG. 6 is implied by the cell numbering of FIG. 10, the method of FIGS. 7-8 could just as easily be applied to FIG. 10. As with FIG. 9, FIG. 10 conforms to the previous depictions in that cells are referred to according to region and cell number, thus 1-1 is cell 1 of region 1, whereas 6-25 refers to cell 25 of region 6. Moreover, FIG. 10 is intended to show diagrammatically the general layout of the cells and regions, and not the specific individual positioning of individual cells. That is, each cell in the figure is shown in contact with each adjacent cell. In practice, individual cells are spaced apart.

FIG. 11 illustrates a method for providing multiple sealing lasers for a display device which has been divided into a plurality of regions for sealing purposes. As depicted in FIG. 11, laser beam 24 has been focused by lens system 36 into the ends of a bundle of optical fibers 38. Each bundle may be further divided into separate sub-bundles 40. The output ends of the individual optical fibers of each sub-bundle 40 may thereafter be divided into a plurality of laser power delivery subsystems with the required power density for the sealing processes as described herein. External beam splitters are therefore not required in the setup depicted in FIG. 11, though beam splitters may be used as an alternative.

As an example of the application of the sealing methods described herein, consider an exemplary display structure corresponding to structure 23 having a rectangular shape with dimensions of 470×730 mm, and further comprising 150 frit frames (e.g. 150 cells) representing 150 individual display elements. Table 1 below lists various other structure parameters of the exemplary display structure.

TABLE 1

| | |
|---|---:|
| Frame width W, μm: | 37.38 |
| Frame length L, μm | 41.54 |
| Total laser path per display (no overlap) | 168 mm |
| Total laser path per substrate (no overlap) | 25,175 mm |
| Total laser path per display (with overlap) | 209 mm |
| Total laser path per substrate (with overlap) | 31,405 mm |
| Required tact time (between sealing starts) | 4 min |
| Chamber load/unload time per substrate | 8 sec |
| Laser-off time during index between display elements (cells) | 1.5 sec |

The various parameters described in Table 1 are defined below and, where appropriate, shown in FIG. 2:

Frame width W: the width of the frit frame of an individual cell;

Frame length L: the length of the frit frame of an individual cell;

Total laser path per display (without overlap): the total path travered by the laser beam per cell without the beam having an overlapping path during the sealing, assuming a single beam Total laser path per substrate (without overlap): the total path traversed by a laser beam per substrate without the beam having an overlapping path, assuming a single beam Total laser path per display (with overlap): the total path travered by the laser beam per cell with the beam having an overlapping path during at least a portion of the sealing on a single cell, assuming a single beam Total laser path per substrate (with overlap): the total path traversed by a laser beam per substrate with the beam having an overlapping path during at least a portion of the sealing on a single cell, assuming a single beam Required tact time: Time required to complete sealing of individual cells on a substrate. Tact time extends from the first "on" condition of the laser for a given substrate, to the first "on" condition for a subsequent (next) substrate. This is assumed to be a given parameter.

Chamber load/unload time per substrate: The time interval between the completion of sealing on a first substrate and the beginning of sealing on a subsequent substrate, and includes the time required to unload a substrate from a chamber for sealing and the time required to load a new substrate into the chamber for sealing. The period extends from the last laser "off" condition for a given substrate to the first laser "on" condition for a subsequent (next) substrate. This is assumed to be a given parameter.

Laser off time during index between display elements (cells): the time interval between the time the laser completes sealing of a first cell and turns off, and the time the laser turns on and begins sealing of a subsequent (next) cell. This is assumed to be a given parameter.

Based on the assumptions of Table 1, Table 2 below lists the required sealing speed for various laser head configurations, that is, for various numbers of laser beams traversing the frit patterns in accordance with the method of FIG. 6. Assuming the parameters provided in Table 1 above, the total path length required for a single laser/head with overlap along a single side of the cell is 31405 mm per substrate. Since the required minimum time for sealing the substrates (tact time) in this example is set by manufacturing needs to be no more than 4 minutes, it is clear that sealing speed for a single laser would need to be about 4486.5 mm/s, which is beyond current process capability. A reduced sealing speed of about 15 mm/s, from Table 2 would require 10 sealing heads. Increasing the laser sealing speed to about 67 mm/s would decrease the required number of sealing beams to 3. Thus, the foregoing example shows how one may trade off between the number of individual laser beams and the traverse speed of the laser beam to accomplish the sealing of a large number of individual cells comprising a plurality of display elements. Of course the achievable sealing speed is related, inter alia, to properties of the frit material (e.g. thermal conductivity) and its height, and these must also be considered.

TABLE 2

| No. laser heads | No. laser indexes | Laser "on" time (sec) | required speed (mm/sec) |
|---|---|---|---|
| 1 | 150 | 7 | 4486.5 |
| 2 | 75 | 120 | 131.4 |
| 3 | 50 | 157 | 66.7 |
| 5 | 30 | 187 | 33.6 |
| 6 | 25 | 195 | 26.9 |
| 10 | 15 | 210 | 15 |
| 15 | 10 | 217 | 9.6 |
| 25 | 6 | 223 | 5.6 |
| 30 | 5 | 225 | 4.7 |

It should be emphasized that the above-described embodiments of the present invention, particularly any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A method of encapsulating a display element comprising:
   a. providing a first substrate and a second substrate separated by a plurality of frit walls arranged in a plurality of rows and columns, each of the rows having a first end and a second end opposite the first end, and at least one display element disposed within an envelope defined by each frit wall and the first and second substrates;
   b. impinging a laser beam on a start point on a first frit wall at the first end of the first row;
   c. traversing the beam along the first frit wall from the start point on the first wall to a stop point on the first frit wall, the traversing passing the start point before reaching the stop point, thereby overlapping a portion of the first frit wall;
   d. extinguishing the laser beam and indexing to a start point on an adjacent frit wall in the first row;
   e. repeating steps b. through d. for each frit wall in the first row; and
   wherein each step of traversing for each frit wall in the first row is in the same direction.

2. The method according to claim 1 further comprising indexing to a last frit wall at the second end of a second row adjacent the first row.

3. The method according to claim 1 further comprising indexing to a first frit wall at the first end of a second row adjacent the first row.

4. The method according to claim 2 further comprising traversing with the laser beam each frit wall in the second row in a direction opposite the traversing of the first row.

5. The method according to claim 1 wherein the plurality of frit walls are divided into a plurality of groups, each group of the plurality of groups being sealed by a separate laser beam.

6. The method according to claim 5 wherein the sealing for a first group of the plurality of groups is performed substantially simultaneously with the sealing for a second group of the plurality of groups.

7. The method according to claim 6 wherein the sealing for the plurality of groups is performed substantially simultaneously.

8. The method according to claim 5 wherein the number of frit walls in a first group of the plurality of groups is different from the number of frit walls in a second group of the plurality of groups.

9. The method according to claim 1 wherein the frit walls are sealed by a plurality of laser beams.

10. The method according to claim 9 wherein the plurality of laser beams are directed through a plurality of optical fibers.

11. The method according to claim 1 wherein the laser beam is directed by a galvometer.

12. The method according to claim 1 wherein the frit walls are sealed by a plurality of laser beams.

13. The method according to claim 12 wherein the plurality of laser beams are directed through a plurality of optical fibers.

14. A method of encapsulating a display element comprising:
   a. providing a first substrate and a second substrate separated by a plurality of frit walls arranged in rows and columns, and at least one display element disposed within an envelope defined by each frit wall and the first and second substrates;
   b. impinging a laser beam on a start point on a first frit wall in a first row;
   c. traversing the beam along the first frit wall from the start point on the first wall to a stop point on the first frit wall;
   d. extinguishing the laser beam and indexing to a start point on an adjacent frit wall in the first row;
   e. repeating steps b. through d. for each frit wall in the first row; and
   wherein the laser beam does not overlap during the traversing for each frit wall.

15. The method according to claim 14 further comprising indexing to a first frit wall in a second row adjacent the first row.

16. The method according to claim 15 further comprising traversing with the laser beam each frit wall in the second row in a direction which is the same as the direction of traversing in the first row.

17. The method according to claim 14 wherein the plurality of frit walls are divided into a plurality of groups, each group frit walls being sealed by a separate laser beam.

18. The method according to claim 17 wherein the sealing for a first group of the plurality of groups is performed substantially simultaneously with the sealing for a second group of the plurality of groups.

19. The method according to claim 18 wherein the sealing for the plurality of groups is performed substantially simultaneously.

20. The method according to claim 17 wherein the number of frit walls in a first group of the plurality of groups is different from the number of frit walls in a second group of the plurality of groups.

* * * * *